United States Patent [19]

Lau et al.

[11] Patent Number: 4,698,294

[45] Date of Patent: Oct. 6, 1987

[54] LAMINATION OF PHOTOPOLYMERIZABLE FILM ONTO A SUBSTRATE EMPLOYING AN INTERMEDIATE NONPHOTOSENSITIVE LIQUID LAYER

[75] Inventors: Tit-Kueng Lau, Wilmington, Del.; Abraham B. Cohen, Springfield, N.J.

[73] Assignee: E. I. Du Pont de Nemours and Company, Wilmington, Del.

[21] Appl. No.: 906,442

[22] Filed: Sep. 12, 1986

[51] Int. Cl.$^4$ .............................................. G03C 5/00
[52] U.S. Cl. .................... 430/325; 430/327; 430/330; 430/311; 430/954; 156/241; 156/307.1; 156/314; 156/325; 156/901
[58] Field of Search ............... 430/327, 325, 330, 311, 430/954; 156/241, 307.1, 314, 325, 901

[56] References Cited

U.S. PATENT DOCUMENTS

| | | | |
|---|---|---|---|
| 2,791,504 | 5/1957 | Plambeck, Jr. | 430/325 X |
| 3,629,036 | 12/1971 | Isaacson | 156/241 |
| 4,069,076 | 1/1978 | Fickes | 156/83 |
| 4,293,635 | 10/1981 | Flint et al. | 430/271 |
| 4,506,004 | 3/1985 | Sullivan | 430/312 |
| 4,522,903 | 6/1985 | Heiart et al. | 430/327 X |

FOREIGN PATENT DOCUMENTS 0040843 12/1981 European Pat. Off. ............ 430/327

*Primary Examiner*—John E. Kittle
*Assistant Examiner*—Cynthia Hamilton

[57] ABSTRACT

Lamination of a photopolymerizable film onto a substrate employs an intermediate nonphotosensitive liquid which is substantially all monomer.

19 Claims, No Drawings

LAMINATION OF PHOTOPOLYMERIZABLE FILM ONTO A SUBSTRATE EMPLOYING AN INTERMEDIATE NONPHOTOSENSITIVE LIQUID LAYER

BACKGROUND OF THE INVENTION

The invention is directed to an improved lamination process of a photopolymerizable film onto a substrate employing a liquid which is present during the application of film to the substrate.

Lamination of a photosensitive material onto a substrate employing an intermediate liquid layer is taught in several U.S. patents using various liquids and application techniques. U.S. Pat. No. 3,629,036 discloses application of a liquid adhering agent, preferably a solvent for a resist containing a small amount of dissolved resist, to a surface of a substrate followed by application of a photosensitive resist film. U.S. Pat. No. 4,069,076 discloses a process for applying a photoresist film to a preimaged pattern relief substrate after flooding the substrate with a solvent or a nonsolvent swelling agent. U.S. Pat. No. 4,293,635 discloses application of a photosensitive composition containing an amphoteric interpolymer to a copper surface wetted with a liquid such as an ethanol-water solution.

U.S. Pat. No. 4,506,004 discloses various embodiments of obtaining printed wiring boards by means of a two layer composite coating. In one embodiment an adhesive photopolymer layer is applied to a printed wiring board in a liquid state displacing air from the printed wiring board surface. A dry film solder mask is temporarily adhered to the underside of a screen printing frame and applied onto the liquid layer prior to processing of the photopolymer layer. In another of the embodiments of the patent nonphotoimaging epoxy layers can be employed.

SUMMARY OF THE INVENTION

The present invention is directed to a process for laminating a photopolymerizable film onto a substrate which comprises the steps of (a) applying to a substrate surface or a photopolymerizable film surface which is preformed and nonliquid a liquid which is substantially nonpotosensitive to actinic radiation and which consists essentially of at least one nongaseous ethylenically unsaturated compound containing at least one ethylenic group having a boiling point above 100° C. at normal atmoshperic pressure and being capable of forming a high polymer by addition polymerization;

(b) laminating the substrate and preformed nonliquid photopolymerizable film through the applied liquid whereby excess liquid is present during the lamination and is forced along at least one edge of the laminated substrate and film;

(c) exposing imagewise to actinic radiation the photopolymerizable film and the liquid;

(d) removing unexposed areas of the photopolymerizable film and the liquid from the substrate.

DETAILED DESCRIPTION OF THE INVENTION

The substrates which are coated in accordance with the teachings of the present invention are varied and can be rigid or flexible. The substrate can be relatively smooth, i.e., having a substantially planar surface or can be nonplanar, i.e., having a raised relief with conductive and nonconductive surface areas. Lamination of a potopolymerizable film (which is not a liquid and is generally present as a solid layer) to a substrate surface can present undesirable results such as due to insufficient adhesion or due to air entrapment. These problems are present with planar substrates and are even more prevalent with substrates having a raised relief. Rough surfaces can be present on planar substrates, e.g., copper cladding applied to an insulating core such as an epoxyglass fiber weave which causes the cladding to follow the undulations of the glass fiber. With substrates having a raised relief particularly due to conductive and nonconductive surface portions, air entrapment can readily occur since dry film in many cases cannot follow the surface configuration. Conventionally substrates will have channels, i.e., holes, extending through the substrate to allow electrical connections to be made to an opposite surface.

The photopolymerizable film which is laminated to the substrate can be chosen from a wide variety of photoresist and solder mask films particularly those which are commercially available. In the case where a solder mask film is applied to a substrate having a raised relief particularly due to circuitry the photopolymerizable film can be thinner than normally employed such as in a range from 0.3 mils to 4.0 mils but preferably 1.0 mils to 2.0 mils. The photopolymerizable film normally is adhered to a support film which is removed subsequent to the lamination procedure. Illustrative of the many patents which disclose various film formulations are U.S. Pat. Nos. 3,469,982 and 4,293,635.

In the lamination procedure, the present invention is an improvement over prior art techniques which employ an intermediate liquid in this step. A problem which exists in lamination of a dry solder mask film directly to a substrate having a raised relief is that air can be easily entrapped between the film and substrate. Use of a liquid is known to displace air during the lamination procedure.

However the present invention is broader in scope since advantages are present both with planar and raised relief substrate surfaces. Criticality is present herein in the type of liquid intermediate the photopolymerizable film and the substrate surface. The liquid should be primarily a compound which is capable of forming a high polymer by photoinitiated polymerization and should have a controlled viscosity. The liquid should be free or substantially free of polymeric materials such as binder which is a substantial component of photopolymerizable dry film and should be free or substantially free from another liquid such as solvent or diluent. The compound also called monomer herein is nongaseous and ethylenically unsaturated preferably containing at least one terminal ethylenic group with a boiling point above 100° C. at normal atmospheric pressure. A more preferred class of monomers has at least two terminal ethylenic groups.

The liquids which can be used in the lamination procedure are varied and can be selected from monomers formulated to be a portion of a photopolymerizable composition. Useful monomers include: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2- dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxy-phenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene. Examples of a more limited class include: tripropylene glycol diacrylate, isobornyl acrylate, dicyclopentenyl acrylate, tetraethylene glycol dimethacrylate, phenyl ethoxylate monoacrylate, trimethylolpropane ethoxylated triacrylate, neopentyl glycol propoxylate diacrylate, and trimethylolpropane triacrylate. Combinations of monomers can be employed which are necessary if a single monomer cannot be directly applied as desired; e.g., if a single monomer is unduly viscous or a solid.

In the laminating procedure it is necessary that adherence of the substrate and film be obtained through the liquid, i.e., delamination does not occur. Since the photopolymerizable film is conventionally supported by another film (which is well known in the art), the adherence of the laminated layers is sufficient to allow removal of the support film from the photopolymerizable film either before or after exposure of the photopolymerizable film to actinic radiation. Suitable support films which cover the photopolymerizable film or its surface which is not laminated include, e.g., transparent polyethylene terephthalate. Disclosures of support films are taught in, e.g., U.S. Pat. Nos. 3,469,982 and 4,293,635.

If the adherence between the substrate and film through the monomer liquid is insufficient after the lamination procedure, another combination of monomer liquid and photopolymerizable film is generally employed. Either another monomer liquid or another film can be utilized. However, in some instances an extended hold time, e.g., greater than 15 minutes, can act to increase adhesion. Also with excessively thick liquid layers, a decrease in the layer may overcome the problem of insufficient adhesion.

With a planar or substantially planar substrate both low and high viscosity liquids can be employed although a high viscosity liquid will generally take more time to apply. Also high viscosity liquids have a tendency to trap air which is undesirable. If a monomer has an unduly high viscosity, a combination of monomers can be used, e.g., high and low viscosity monomers. However for substrates which have a raised relief relatively low viscosity liquids are preferred particularly due to the need to remove air which can be entrapped. Generally the viscosity of the liquid in such case will not be greater that 400 centipoise and more preferably not greater than 200 centipoise. A most preferred range of viscosity is from 5 to 50 centipoise. Typically the raised relief will be at least 0.7 mil with typical circuit heights ranging from 1.4 mils to 4.0 mils and higher.

Criticality is present in this invention in the application of the liquid in the lamination procedure and the composition of the liquid. The liquid is applied in excess over the amount used to form a layer between the substrate and photopolymerizable film and a moving pressure front forces excess liquid along at least one side portion of the two surfaces as they are laminated onto each other. Since the liquid is employed in excess, various techniques of application are possible to obtain a liquid layer between the substrate and film surface. The liquid can be applied to the substrate, the film or both such as an interface formed by these materials. Conventionally a pressure roller can be employed which applies pressure to the film in a laminating operation and squeezes excess liquid as a moving front ahead of the pressure roller as it contacts the photopolymerizable film. Liquid will generally ecape from two side portions of the substrate and film (i.e., parallel to the direction of movement in the lamination procedure) if the lamination procedure is undertaken with the substrate in a horizontal position with lamination in a vertical mode (e.g. the substrate is held vertically and travels in a horizontal direction), liquid will generally escape from at least the bottom edge.

Removal of the excess liquid along the sides of the substrate and film is undertaken prior to the exposure step of the photopolymerizable film to actinic radiation if the liquid contaminates the phototool or other contacting equipment. With out-of-contact exposure, removal of excess liquid may not be necessary since the liquid does not touch a phototool. The manner of liquid removal is varied and preferably involves a spray of another liquid composition which serves to cause physical removal. Preferably the liquid is a not a solvent for the photopolymerizable film. A hydrophilic liquid such as water is preferred. Another technique for excess removal of the monomer liquid is by physically scraping the substrate and film although such method can tear the film. For optimum results the laminated substrate ordinarily will conventionally have a dry surface prior to exposure to actinic radiation (unless exposure is through a liquid interface such as disclosed in U.S. Pat. No. 4,518,667).

Without being bound to any theory or mode of operation, it is considered that the monomer liquid in the lamination operation can act to leach constituents from the photopolymerizable film into the monomer liquid, imbibe into the film, or both. Such leaching can include a hotoinitiator from the nonliquid photopolymerizable film which in turn can make the liquid photosensitive and photoimageable simultaneously with the film when it is imaged. This leaching effect can be enhanced by storage of the laminated materials prior to an imaging operation wherein actinic radiation is imagewise applied to the photopolymerizable film.

If lamination is undertaken at ambient temperature (about 22° C.), a difference in result has been visually observed between laminated materials without hold time compared to laminated materials with hold times. Without a hold time, i.e., observation immediately after lamination a liquid interface readily has been observed between the substrate and the photopolymerizable film. If the laminated material is held for a short time (e.g., about 15 minutes) and exposed, the liquid/film interface has been difficult to discern. Likewise in a functional manner, samples which are immediately exposed through a phototool after ambient temperature lamination show a larger undercut of the image after development. Undercut means the erosion of the liquid/film under the surface and at the edge of an area which has been exposed to actinic radiation. Samples held a short time show much better sidewall geometry, i.e., the wall portion of the exposed polymerized film is generally straighter and more uniform in appearance.

It is believed that the monomer liquid acts as a precursor to a photosensitive liquid and has a degree of photosensitivity imparted to it from the laminated film. Ordinarily it is desirable that a hold time of at least 15 minutes, e.g., a hold time in the range of 15 minutes to 48 hours and longer, be employed between the lamination procedure and the imaging operation of exposure to actinic radiation to cause photopolymerization of the photosensitive dry film. An extended hold time may not be necessary particularly if high temperature (150°-200° F.) and slow lamination (e.g., less than 2 feet per minute) lamination is performed. The liquid and photopolymerizable film are considered to mix more readily at higher temperatures and slow lamination speeds.

While a hold time is desirable in many instances particularly when the substrate has a raised relief, it is not necessary that a hold time is employed. Similar results have been shown after imaging when the substrate surface is planar or substantially planar. For planar surfaces, only about 0.1 mil to 0.3 mils of liquid contribute to the overall polymer thickness (e.g., typically a 1.5 mil film laminated over a planar surface prewet with liquid would result in a total thickness of 1.6 to 1.8 mils). At liquid thicknesses such as these, hold time is believed to be less critical because radicals formed or migrating in the 1.5 mil dry photopolymerizable film can also migrate the additional distance, e.g., 0.1 to 0.3 mils, in the liquid to give sufficient polymerization without any apparent undercut. Therefore such liquid thickness is considered optimum with planar surfaces, i.e., up to about 0.3 mil in thickness of liquid. With a raised relief surface the liquid will generally have the height of the relief ranging to about 0.1 to 0.3 mils above it, i.e., up to 0.3 mils of thickness of liquid above the relief.

The monomer liquid is considered to have advantages over prior art swelling agents which are not monomers of the type disclosed herein. A swelling agent which is not a monomer does not crosslink because such swelling agent does not have any pendant groups and therefore will not change its nature during imaging exposure (exposure to actinic radiation such as ultraviolet light) or curing. Large undercut images have been experienced with prior art swelling agents after image exposure and development, i.e., blisters or solder contamination have occurred in comparative testing. Also loss of adhesion may occur during downstream curing and soldering operations. For example, channels or "holes" described previously that are tented may be filled with swelling agent which has a boiling point less than normal soldering temperatures. In this case the boiling liquid may burst through or lift the mask from its position. However, with thin areas of swelling solvent (e.g., 0.1 to 0.3 mils), loss of adhesion, blistering, lifting, etc, may be less likely to occur. Thus, for very thin relief imaged panels without holes, a swelling solvent laminated with a thick film, may be satisfactory the panel may survive all downstream solder mask testing. The present invention can be employed where a swelling solvent cannot be used.

The coating liquid is free or substantially free of polymeric components which are binders. However the liquid can contain small amounts of additives such as flame retardants, colorants, wetting agents or thermal crosslinkers which are known additives in photosensitive compositions. Unless needed for a specific application generally an additive such as a thermal crosslinker will not be employed.

Since an important advantage of the present coating liquid in combination with the dry photopolymerizable film is the ability to tent over holes in a substrate, i.e., cover the hole in the lamination procedure without breaking the film or adversely plugging the hole, the viscosity of the coating liquid tailored to the hole size is important. The viscosity will generally not be greater than 400 centipoise and generally not greater than 200 centipoise for solder mask utility wherein the substrates has a raised relief. More preferably the viscosity of the liquid will be in the range of 5 to 50 centipoise. Holes in the substrate, i.e., channels, are generally in the range of from 10 to 250 mils. An optimum liquid viscosity for a given hole or different size holes on a single substrate can be readily determined by application of different viscosity liquids to the substrate and evaluating the results obtained. For hole filling, small holes e.g. (10 to 40 mil diameter) can be filled more readily with lower viscosity liquids (e.g. 1 to 100 centipoise) and tented by the film as well. On the other hand large holes remained filled with higher viscosity materials (lower viscous liquids drain rapidly) such that a successful tent can be achieved.

After the lamination procedure the photopolymerizable film is processed in a known manner including imagewise exposure to actinic radiation and development in a liquid which removes nonphotopolymerized areas of the film to expose portions of the substrate to allow, e.g., plating or etching. The photopolymerized film may be stripped from the substrate or it may remain permanently in place such as with use of the film as a solder mask to protect areas of the substrate from application and adherence of molten solder.

In yet another embodiment of the present invention two separate liquids are applied in the lamination of the nonliquid photopolymerizable film. Both liquids will be primarily monomer (i.e., a compound as previously described), but each liquid can be tailored to obtain specific properties. Illustratively a first liquid which initially contacts the substrate surface can be tailored to wet the surface to overcome air entrapment in the case where the substrate has a raised relief. Furthermore the liquid can be tailored to have an optimum viscosity in combination with its wetting ability.

For the second liquid which is not applied to contact the substrate but is applied onto the first liquid, it likewise can be tailored to obtain optimum properties. Illustratively the second liquid can be applied directly onto the photopolymerizable film immediately prior to the lamination procedure. Although the contact line prior to the lamination procedure may be short nevertheless such liquid can serve to soften the film to add in conformance of the film to the substrate through the two liquid layers.

The second liquid can differ from the first liquid in its viscosity of both liquids can be similar. Each liquid can have properties which can be maximized dependent upon the surface it is to contact, i.e., either the substrate or the photopolymerizable film. Both liquids can have the criteria previously described for composition content and viscosity.

An advantage of use of a liquid which consists essentially of monomer compared to photopolymerizable liquids of the prior art is the insensitivity of the liquid to actinic radiation while stored. The liquid need not be protected from light in the same manner as a photosensitive liquid. Surprisingly the liquid which cannot function in of itself as a solder mask functions in combination with a solder mask film for solder mask use.

In the following examples all parts and percentages are by weight and degrees are in Fahrenheit unless otherwise indicated.

EXAMPLE 1

A series of printed circuit board panels of a size 18"×24" containing a raised relief height of about 3.5 mils on both panel surfaces with approximately 2400 holes ranging in size from 17 mils to 35 mils diameter was coated with tripropyleneglycol diacrylate (having a viscosity of 14.5 centipoise at 25° C.) via a wetting sponge. The liquid was not applied uniformly but was applied in an excessive amount used to form a liquid layer in a subsequent lamination procedure.

The monomer wet panels while held in a vertical position were passed in a horizontal direction through a nip of two rolls while Vacrel ® 8000 solder mask film of 1.5 mil thickness was laminated onto the wet panels. The temperature of the rolls was in the range of 70° to 100° F. with nip pressure of about 35 psi controlled by air cylinders. Each roll was of a type employed in a Riston ® "I" System lamination but contained a Teflon ® polytetrafluoroethylene sleeve covering a normal rubber coating.

In the lamination procedure the monomer liquid coating was present in a thickness of about 0.2 mils measured away from the raised relief of the panel with the coating ranging to about 3.5 mils immediately adjacent the raised relief and approximately 0.2 mils above the raised relief.

The panel edges were trimmed and residual monomer liquid was removed by a spray of water.

The panels were held for 30 minutes after lamination and then exposed for 120 units (12 seconds) on Du Pont's PC-130 exposure unit using a 5KW setting. After exposure the Mylar ® polyester coversheet was removed and the sample was developed in an ASI processor with a 1% aqueous sodium carbonate solution at 105° F. Development time was about 75 seconds. After development boards were cured in an Argus UV unit and then thermally baked for 1 hour at 300° F.

The boards gave successful results as a solder mask when evaluated in a typical manner for solder mask properties including tests for solder resistance, solvent resistance, electrical properties, adhesion, thermal shock resistance and flammability. Testing followed the standard specification procedure recommended by the Institute for Interconnecting and Packaging Electronic Circuits present in their publication IPC-SM-840.

EXAMPLE 2

The same process as Example 1 was performed except the liquid was modified by the addition of a small amount of Cymel ®303 crosslinking agent mixed with tripropylene glycol diacrylate. Only a few microbubbles were evident after lamination which did not interfere with the functionality of the solder mask film. The thermal bake was reduced to 30 min at 300° F. and found to be more effective than the sample without thermal crosslinker. One drawback was some undercut of the developed image was observable.

EXAMPLE 3

Riston ®3813 film was laminated over a double sided copper clad panels wet with TRPGDA in similar fashion as in Example 1 except the lamination was undertaken at room temperature. Panels with and without through holes were employed. The laminated panel was given 50 mg/cm exposed (Du Pont PC-130 for 5 sec.); developed in an ASI processor at 85° for 40 sec in a 1% aqueous sodium carbonate developer solution. Etching was performed in a Chemcut etcher using an acidic ferric chloride etching solution. Etch times were dependent upon copper thickness. After etching, the resist was removed in a 2% aqueous potassium hydroxide solution at 140° F. Satisfactory results were again obtained.

EXAMPLE 4

The process of Example 1 was repeated on various sample substrates of an insulating layer of a glass-epoxy weave with all different types of metal circuitry (e.g., copper, solder, gold) to form a raised relief. Substrate thickness varied from 30 mils to 90 mils with a circuit height from 1.4 to 4.0 mils. Panels with various metallized circuit patterns had through holes metallized in a similar manner such that each side of the board was electrically connected to the other. Hole size varied from about 12 mils to 250 mils. Successful test results were obtained.

What is claimed is:
1. A process for laminating a photopolymerizable film to a substrate which comprises the steps of
    (a) applying to a substrate surface or a photopolymerizable film surface which is preformed and nonliquid, a liquid which is substantially nonphotosensitive to actinic radiation and which consists essentially of at least one nongaseous ethylenically unsaturated compound containing at least one ethylenic group having a boiling point above 100° C. at normal atmospheric pressure and being capable of forming a high polymer by addition polymerization
    (b) laminating the substrate and preformed nonliquid photopolymerizable film through the applied liquid whereby excess liquid is present during the lamination and is forced along at least one edge of the laminated substrate and film whereby adherence is obtained of the substrate to the film through the liquid;
    (c) exposing imagewise to actinic radiation the photopolymerizable film and the liquid;
    (d) removing unexposed areas of the photopolymerizable film and the liquid from the substrate.
2. The process of claim 1 wherein the substrate has a raised relief.
3. The process of claim 2 wherein the liquid has a viscosity not greater than 400 centipose.

4. The process of claim 3 wherein the liquid has a viscosity not greater than 200 centipose.

5. The process of claim 1 wherein the liquid has a viscosity in the range from 5 to 50 centipoise.

6. The process of claim 1 wherein a hold time of not less than 15 minutes is present between steps (c) and (d).

7. The process of claim 1 wherein the substrate has a plurality of holes.

8. The process of claim 1 wherein excess liquid is removed between steps (b) and (c).

9. The process of claim 8 wherein a spray of another liquid is used to remove the liquid.

10. The process of claim 8 wherein the other liquid is hydrophilic.

11. The process of claim 8 wherein the other liquid comprises water.

12. The process of claim 1 wherein the substrate is substantially planar.

13. The process of claim 1 wherein the liquid is substantially free of a thermal crosslinking agent.

14. The process of claim 1 wherein the liquid contains a thermal crosslinking agent.

15. The process of claim 1 wherein the photopolymerizable film is solder mask and subsequent to step (d) exposed portions of the substrate and the exposed film is contacted with molten solder.

16. The process of claim 1 wherein the compound has at least one terminal ethylenic group.

17. The process of claim 15 wherein the compound has at least two terminal ethylenic groups.

18. The process of claim 1 wherein at least two liquid layers are applied in step (a).

19. The process of claim 1 wherein liquid is applied to the substrate surface and film surface in step (a).

* * * * *